(12) United States Patent
Shen et al.

(10) Patent No.: US 9,554,468 B2
(45) Date of Patent: Jan. 24, 2017

(54) PANEL WITH RELEASABLE CORE

(71) Applicant: Intel Corporation, Santa Clara, CA (US)

(72) Inventors: Ching-Ping Janet Shen, Gilbert, AZ (US); Charan K. Gurumurthy, Higley, AZ (US); Dilan Seneviratne, Phoenix, AZ (US); Ravi Shankar, Chandler, AZ (US); Liwen Jin, Chandler, AZ (US); Deepak Arora, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 304 days.

(21) Appl. No.: 14/227,697

(22) Filed: Mar. 27, 2014

(65) Prior Publication Data

US 2015/0181713 A1 Jun. 25, 2015

Related U.S. Application Data

(63) Continuation-in-part of application No. 14/135,168, filed on Dec. 19, 2013.

(51) Int. Cl.
*H05K 1/18* (2006.01)
*H05K 3/30* (2006.01)
(Continued)

(52) U.S. Cl.
CPC ............ *H05K 1/183* (2013.01); *B32B 3/263* (2013.01); *B32B 7/12* (2013.01); *B32B 15/08* (2013.01); *B32B 15/20* (2013.01); *B32B 37/1284* (2013.01); *B32B 37/10* (2013.01); *B32B 2307/202* (2013.01); *B32B 2457/08* (2013.01); *H01L 23/13* (2013.01); *H01L 23/5389* (2013.01);
(Continued)

(58) Field of Classification Search
CPC ........ H05K 1/183; H05K 1/0271; H05K 3/30; H05K 3/4652; H05K 2201/0338
See application file for complete search history.

(56) References Cited

U.S. PATENT DOCUMENTS 5,063,658 A * 11/1991 Wild ...................... H05K 3/205
156/233
5,306,670 A * 4/1994 Mowatt ............... H01L 23/5383
257/E23.172

(Continued)

OTHER PUBLICATIONS

"U.S. Appl. No. 14/135,168, Examiner Interview Summary mailed Aug. 26, 2015", 2 pgs.

(Continued)

*Primary Examiner* — Jeremy C Norris
*Assistant Examiner* — Nathan Milakovich
(74) *Attorney, Agent, or Firm* — Schwegman Lundberg & Woessner, P.A.

(57) ABSTRACT

Generally discussed herein are systems and apparatuses that can include a releasable core panel. The disclosure also includes techniques of making and using the systems and apparatuses. According to an example a technique of making a releasable core panel can include coupling an inner foil to a base, situating an adhesive layer on the inner foil, such that the inner foil is substantially flush with a periphery of the base, situating an outer conductive foil on the adhesive layer, or covering an interface between the adhesive layer, the inner foil and the outer conductive foil with a protective material.

23 Claims, 12 Drawing Sheets

(51) Int. Cl.
   *H05K 3/46* (2006.01)
   *B32B 3/26* (2006.01)
   *B32B 15/20* (2006.01)
   *B32B 37/12* (2006.01)
   *B32B 7/12* (2006.01)
   *B32B 15/08* (2006.01)
   *B32B 37/10* (2006.01)
   *H05K 3/28* (2006.01)
   *H01L 23/13* (2006.01)
   *H01L 23/538* (2006.01)

(52) U.S. Cl.
   CPC ....... *H01L 2924/0002* (2013.01); *H05K 1/185* (2013.01); *H05K 3/284* (2013.01); *Y10T 428/2495* (2015.01); *Y10T 428/24612* (2015.01); *Y10T 428/31678* (2015.04)

(56) References Cited

U.S. PATENT DOCUMENTS

| | | | | |
|---|---|---|---|---|
| 5,806,177 | A * | 9/1998 | Hosomi | H05K 3/4655 156/233 |
| 6,175,084 | B1 * | 1/2001 | Saitoh | H01L 23/142 174/250 |
| 6,523,734 | B1 | 2/2003 | Kawai et al. | |
| 6,663,980 | B1 | 12/2003 | Saijo et al. | |
| 7,222,421 | B2 * | 5/2007 | Nakamura | H05K 3/0097 156/248 |
| 9,161,452 | B2 * | 10/2015 | Huang | H05K 1/183 |
| 2005/0082669 | A1 | 4/2005 | Saijo et al. | |
| 2007/0095471 | A1 * | 5/2007 | Ito | H01L 23/5385 156/293 |
| 2007/0124924 | A1 * | 6/2007 | Nakamura | H05K 3/0097 29/830 |
| 2007/0277909 | A1 | 12/2007 | Tsukahara et al. | |
| 2008/0053686 | A1 * | 3/2008 | Ishii | G11B 5/486 174/255 |
| 2008/0054448 | A1 * | 3/2008 | Lu | H01L 21/4882 257/707 |
| 2008/0202661 | A1 * | 8/2008 | Kobayashi | H01L 21/4857 156/50 |
| 2009/0025217 | A1 * | 1/2009 | Kamei | G11B 5/486 29/847 |
| 2011/0154657 | A1 * | 6/2011 | Chuang | H05K 3/0097 29/829 |
| 2011/0155443 | A1 * | 6/2011 | Maeda | H01L 21/4846 174/267 |
| 2013/0143062 | A1 * | 6/2013 | Kaneko | B32B 38/10 428/614 |
| 2014/0036465 | A1 * | 2/2014 | Hu | H05K 1/181 361/767 |
| 2014/0078706 | A1 * | 3/2014 | Hu | H01L 21/6835 361/771 |
| 2014/0090879 | A1 * | 4/2014 | Seneviratne | H01L 24/18 174/257 |
| 2014/0177193 | A1 * | 6/2014 | Jin | H01L 24/19 361/764 |
| 2014/0300009 | A1 * | 10/2014 | Hsu | H01L 23/49 257/784 |
| 2014/0305683 | A1 * | 10/2014 | Li | H05K 1/14 174/254 |
| 2014/0367155 | A1 * | 12/2014 | Huang | H05K 1/183 174/260 |
| 2015/0008566 | A1 * | 1/2015 | Gerber | H01L 24/97 257/668 |
| 2015/0111000 | A1 * | 4/2015 | Sasaki | B32B 7/04 428/157 |
| 2015/0174858 | A1 | 6/2015 | Shankar et al. | |
| 2015/0174859 | A1 | 6/2015 | Erie et al. | |
| 2015/0181717 | A1 | 6/2015 | Shen et al. | |
| 2016/0035661 | A1 * | 2/2016 | Suzuki | H01L 23/49822 174/251 |

OTHER PUBLICATIONS

"U.S. Appl. No. 14/135,168, Response filed Aug. 11, 2015 to Restriction Requirement mailed Jul. 28, 2015", 8 pgs.
"U.S. Appl. No. 14/135,168, Response filed Oct. 20, 2015 to Restriction Requirement mailed Aug. 31, 2015", 9 pgs.
"U.S. Appl. No. 14/135,168, Restriction Requirement mailed Jul. 28, 2015", 7 pgs.
"U.S. Appl. No. 14/135,168, Restriction Requirement mailed Aug. 31, 2015", 6 pgs.
"U.S. Appl. No. 14/227,750, Non Final Office Action mailed Oct. 22, 2015", 6 pgs.
"U.S. Appl. No. 14/227,750, Response filed Aug. 11, 2015 to Restriction Requirement mailed Jul. 29, 2015", 8 pgs.
"U.S. Appl. No. 14/227,750, Restriction Requirement mailed Jul. 29, 2015", 5 pgs.
Chiu, H. T, et al., "Study on mechanical properties and intermolecular interaction of silicone rubber/polyurethane/epoxy blends", Journal of Applied Polymer Science, 89(4), (Jul. 25, 2003), 959-970.
Hou, S. S, et al., "Function and performance of silicone copolymer. Part IV. Curing behavior and characterization of epoxy—siloxane copolymers blended with diglycidyl ether of bisphenol-A", Polymer, 41(9), (Apr. 2000), 3263-3272.
"U.S. Appl. No. 14/135,168, Examiner Interview Summary mailed Mar. 2, 2016", 3 pgs.
"U.S. Appl. No. 14/135,168, Examiner Interview Summary mailed Jul. 1, 2016", 3 pgs.
"U.S. Appl. No. 14/135,168, Final Office Action mailed Apr. 25, 2016", 7 pgs.
"U.S. Appl. No. 14/135,168, Non Final Office Action mailed Feb. 2, 2016", 6 pgs.
"U.S. Appl. No. 14/135,168, Response filed Mar. 25, 2016 to Non Final Office Action mailed Feb. 2, 2016", 5 pgs.
"U.S. Appl. No. 14/135,168, Response filed Jun. 27, 2016 to Final Office Action mailed Apr. 25, 2016", 6 pgs.
"U.S. Appl. No. 14/227,723, Non Final Office Action mailed May 20, 2016", 26 pgs.
"U.S. Appl. No. 14/227,750, Advisory Action mailed Apr. 6, 2016", 3 pgs.
"U.S. Appl. No. 14/227,750, Examiner Interview Summary mailed Mar. 2, 2016", 3 pgs.
"U.S. Appl. No. 14/227,750, Final Office Action mailed Feb. 3, 2016", 6 pgs.
"U.S. Appl. No. 14/227,750, Notice of Allowance mailed May 11, 2016", 7 pgs.
"U.S. Appl. No. 14/227,750, Response filed Mar. 25, 2016 to Final Office Action mailed Feb. 3, 2016", 5 pgs.
"U.S. Appl. No. 14/227,750, Response filed Apr. 19, 2016 to Advisory Action mailed Apr. 6, 2016", 5 pgs.
"U.S. Appl. No. 14/227,750, Response filed Dec. 29, 2015 to Non Final Office Action mailed Oct. 22, 2015", 10 pgs.

* cited by examiner

PANEL WITH RELEASABLE CORE

RELATED APPLICATION

This application is a continuation-in-part of U.S. patent application Ser. No. 14/135,168 with filing date Dec. 19, 2013, which is incorporated herein by reference in its entirety.

TECHNICAL FIELD

Examples generally relate to panel architectures and methods, such as can be used in a substrate manufacturing process.

TECHNICAL BACKGROUND

Substrate manufacturing technology can include the use of panels to help increase the number of dies that can be manufactured at a given time. Substrate manufacturing can be inefficient, wasteful, or cost prohibitive. Such problems can be prevalent when building substrates using one or more panels.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate generally to substrates or panels, such as panels that can include coreless or cored substrates built thereon, and techniques of making and using the same. Examples also relate to systems that can include one or more of the substrates or panels.

Figure 1:
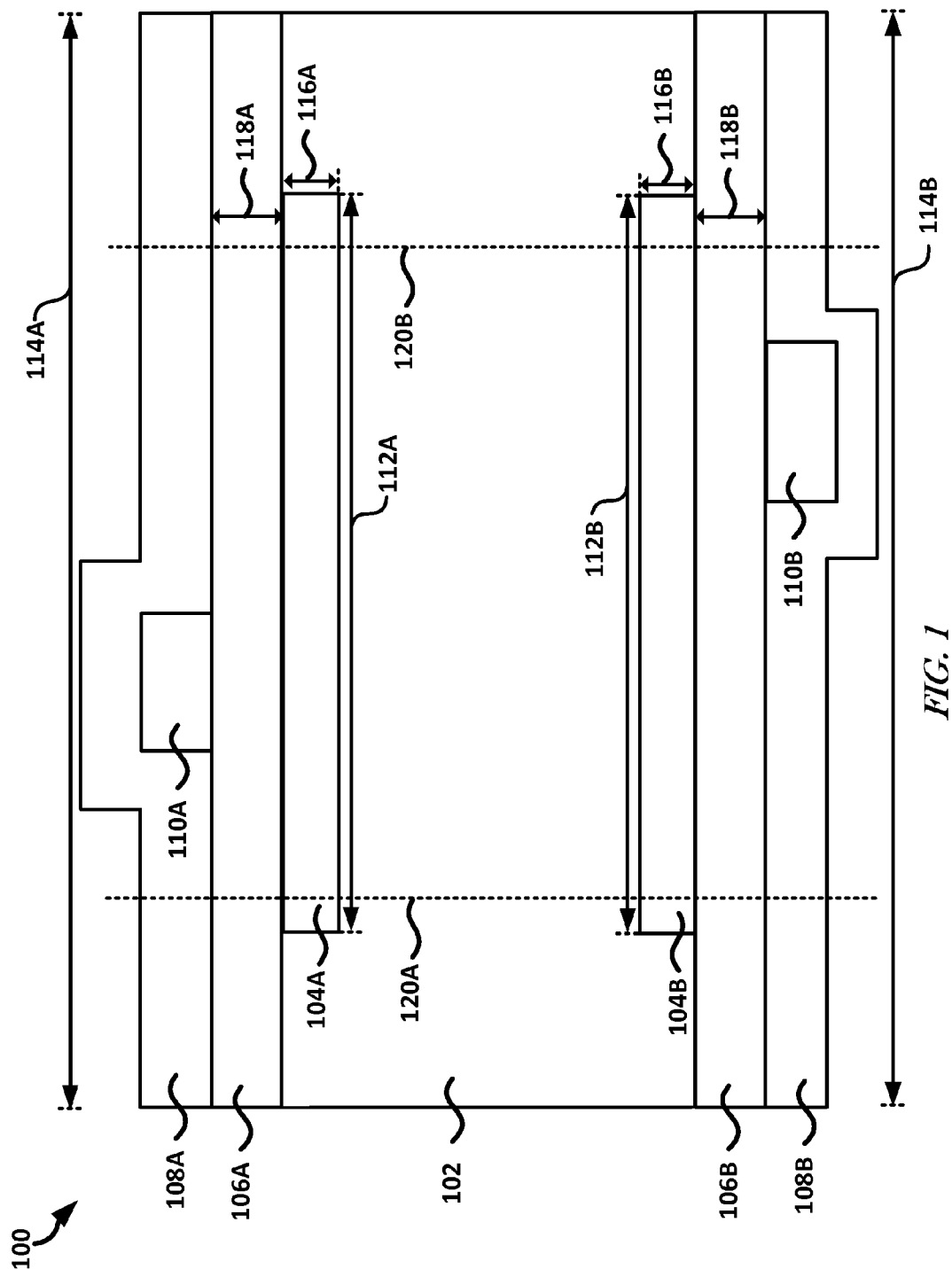
FIG. 1 shows a block diagram of an example of a core panel architecture.

FIG. 1 shows an example of a core panel 100. The panel 100 can include a base 102, an inner foil 104A or 104B, an outer conductive foil 106A or 106B, and a dielectric material 108A or 108B (e.g., an etch stop or build up material) with a die 110A or 110B situated on the outer conductive foil 106A-B and embedded at least partially in the dielectric material 108A-B. The inner foil 104A-B and the outer conductive foil 106A can include a width 112A or 112B that is smaller than a width 114A or 114B of the outer conductive foil 106A-B or the base 102.

The base 102 can begin as a substantially rectangular structure and be processed to be generally "H" shaped, such as by forming a recess in each side of the base 102. The inner foil 104A-B and the outer conductive foil 106A-B can be held in place, such as by vacuum sealing (e.g., hot pressing or pressing and curing) the outer conductive foil 106A-B to the inner foil 104A-B and the base 102, such as in a vacuum environment. Vacuum sealing can also include subjecting the base 102, inner foil 104A-B, and the outer conductive foil 106A-B to higher pressure conditions than one bar, such as in the vacuum environment.

The inner foil 104A-B can include a width 112A or 112B that is smaller than a width 114A or 114B of the outer conductive foil 106A-B. The inner foil 104A-B can include a thickness 116A or 116B that is less than a thickness 118A or 118B of the outer conductive foil 106A-B.

Figure 2:
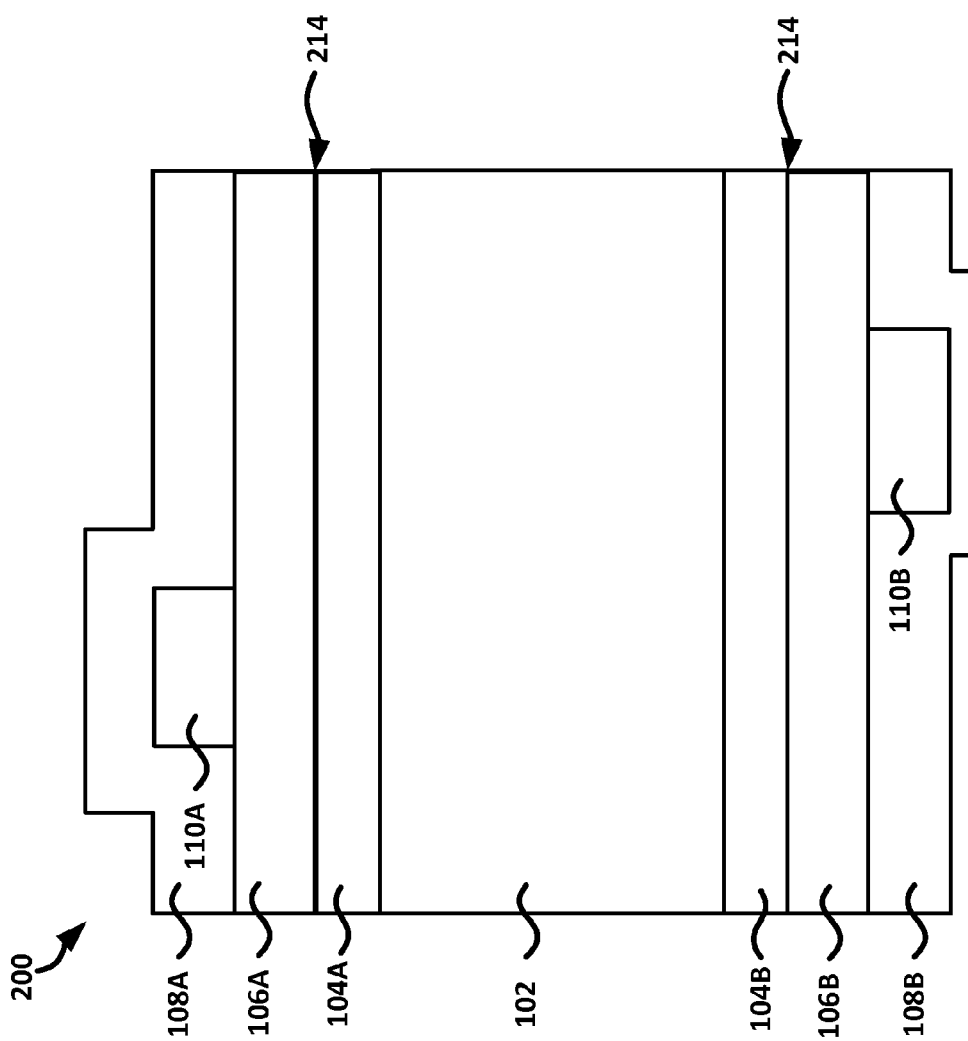
FIG. 2 shows a block diagram of an example of the core panel of FIG. 1 after being cut.

An advantage of the panel 100 is that two dies 110A-B can be (e.g., simultaneously) mounted on the outer conductive foil 106A-B on each side of the panel 100. The panel 100 can be cut, such as along the dotted lines 120A and 120B, to form the panel 200, such as shown in FIG. 2. The die 110A-B can be peeled away from the base 102, such as at the interface 214 between the inner foil 104A-B and the outer conductive foil 106A-B. The outer conductive foil 106A-B can be removed (e.g., etched) from the dielectric material 108A-B, such as to leave just the die 110A and the substrate (e.g., dielectric layers with traces, vias, interconnects, etc.) or package that the die 110 is built in or onto.

A disadvantage of the panel 100 can include thick (e.g., greater than eighteen micrometers) inner foils and outer conductive foils increasing the cost of the panel 100. The thicker conductive foils can help alleviate effects of wrinkling or warping in the conductive foils in the manufacturing process, however, the thicker conductive foils are expensive compared to thinner foils.

Figure 3:
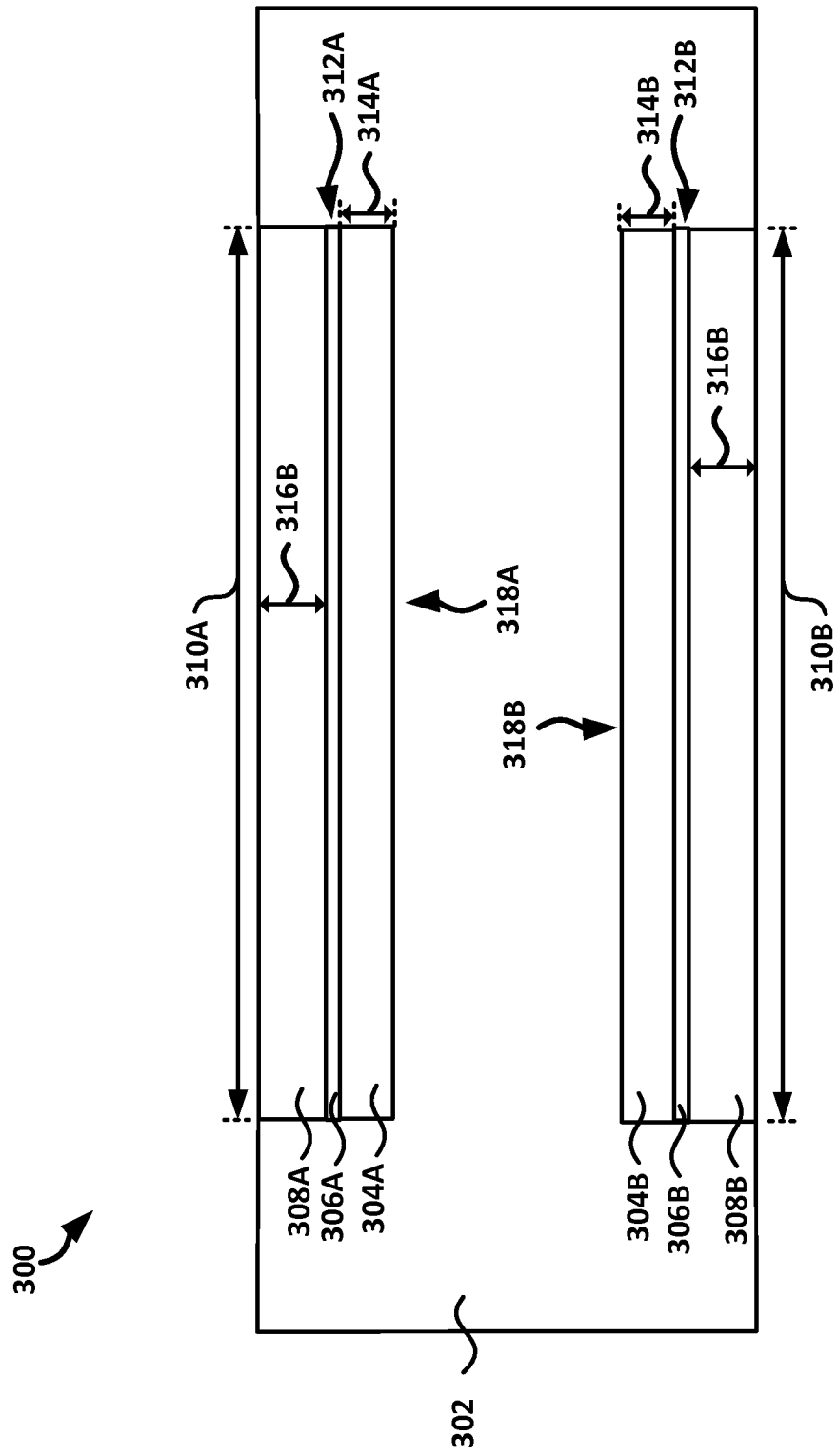
FIG. 3 shows a block diagram of an example of a core panel, according to one or more embodiments.

FIG. 3 shows an example of a core panel 300 according to one or more embodiments. The core panel 300 can include a base 302, an inner foil 304A or 304B, an adhesive layer 306A or 306B, or an outer conductive foil 308A or 308B. The inner foil 304A-B can include a thickness 314A or 314B that is less than a thickness 316A or 316B of the outer conductive foil 308A-B (i.e. the outer conductive foil 308A-B can be thicker than the inner foil 304A-B).

The inner foil 304A-B and the outer conductive foil 308A-B can be substantially the same width 310A or 310B. The inner foil 304A-B or the outer conductive foil 308A-B can be situated at least partially in a recess 318A or 318B of the base 302, such as shown in FIG. 3. By including inner foil 304A-B and outer conductive foil 308A-B that are situated at least partially in the base 302 (e.g., at least partially in a recess 318A or 318B of the base 302), an interface 312A or 312B between the adhesive layer 306A-B and the inner foil 304A-B or outer conductive foil 308A-B can be protected from an external influence (e.g., force) that could shift or delaminate the outer conductive foil 308A-B from the inner foil 304A-B. The interface 312A-B can be situated in a recess 318A or 318B of the base 302, such as to protect the interface 312A-B from the external influence. The external influence can be introduced during a manufacturing process, such as manufacturing a substrate, die, or package on or over the outer conductive foil 308A-B. The external influence can include a physical bump, a chemical interaction, or heat, among other external influences.

Arranging the adhesive layer 306A-B between the inner foil 304A-B and the outer conductive foil 308A-B can allow the outer conductive foil 308A-B to be peeled away from the inner foil 304A-B. However, with the adhesive layer 306A-B between the inner foil 304A-B and the outer conductive foil 308A, there is a risk that the outer conductive foil 308A-B will be delaminated from the inner foil 304A-B. By positioning the interface 312A-B of the adhesive layer 306A-B and the inner foil 304A-B or outer conductive foil 308A-B in the recess 318A-B of the base 302, the interface 312A-B can be protected (e.g., shielded) from the external influence.

If the interface 312A-B is not protected, the inner foil 304A-B or the outer conductive foil 308A-B can be damaged, warped, or otherwise deformed during a manufacturing process. Also, if the interface 312A-B is not protected, the outer conductive foil 308A-B can be prematurely released from the inner foil 304A-B during a manufacturing process. The manufacturing process can include at least partially building a substrate on the top or bottom of the panel 300, such as at an outer surface of the outer conductive foil 308A-B.

The base 302 can include a material that is rigid enough to withstand processing at a substrate manufacturing factory and retain shape. In one or more embodiments, the base 302 can include a material impregnated with a polymer. In one or more embodiments, the base 302 can include a carbon material impregnated with an epoxy or resin. In one or more embodiments, the base 302 can include a metal, plastic, or other substantially rigid material. The base 302 can be generally "H" shaped or, in an embodiment in which one substrate is to be manufactured on the panel, the panel can be generally "u" shaped with a recess in only one side of the base 302.

The inner foil 304A-B can be affixed to the base 302. The inner foil 304A-B can include a conductive material such as copper, gold, silver, aluminum, a combination thereof, or other conductive material. In one or more embodiments, the thickness 314A-B of the inner foil 304A-B can be between about one and thirty micrometers. In one or more embodiments, the thickness 314A-B of the inner foil 304A-B can be between about two and fifteen micrometers. In one or more embodiments, the thickness 314A-B of the inner foil 304A-B can be between about two and six micrometers. In one more embodiments, the thickness 314A-B of the inner foil 304A-B can be between about three and five micrometers. In one or more embodiments, the thickness 314A-B of the inner foil 304A-B can be about five micrometers.

The adhesive layer 306A-B can releasably couple the outer conductive foil 308A-B or to the inner foil 304A-B. The adhesive layer 306A-B can include an epoxy, resin, a combination thereof, or other material. The adhesive layer 306A-B can be pressed (e.g., hot pressed, baked with pressure, or laminated) into the inner foil 304A-B. Such pressing can help provide a releasable coupling between the inner foil 304A-B and the outer conductive foil 308A-B, such as shown in FIG. 3.

The base 302 and the outer conductive foil 308A-B can be releasably uncoupled, such as by mechanically removing (e.g., pulling) the outer conductive foil 308A-B away from the inner foil 304A-B. The outer conductive foil 308A-B can be removed from the inner foil 304A-B after a substrate has been manufactured on the panel 300 (see FIG. 6).

The adhesive layer 306A-B can include a methyl ethyl ketone and toluene solvent with polydimethyl siloxane and bisphenol A based epoxy. An adhesive layer 306A-B made from these materials can suffer from phase separation between the epoxy and silicone over time. Heat can cause blisters to form in the adhesive layer 306A-B made from these materials. The adhesive strength of such adhesive layer 306A-B can degrade over time. An adhesive layer made of these materials can have poor line yields, such as in a SPTD factory.

As used herein releasably coupling means to couple such that a mechanical coupling through the adhesive layer 306A-B can be broken without requiring excessive force or damaging the items mechanically coupled through the adhesive layer 306A-B. The adhesive layer 306A-B can be released from an item by exerting a relatively small amount of force, such as about five Newtons per meter to about one hundred Newtons per meter on or near the adhesive layer 306A-B.

The adhesive layer 306A-B can include one or more epoxy silicone copolymers or blends of polymers, silicone, or epoxy. Different blends can be used to make adhesive layer 306A-B with varying mechanical properties, such as depending on the volume weight percent of polymer, silicone, or epoxy used. The mechanical properties can include hardness, elasticity, stickiness, or other mechanical property.

The adhesive layer 306A-B can include an epoxy and silicone blend. For example, siloxane and epoxy resin can be blended together with a carboxylic acid anhydride hardener, such as to produce a stable or well-blended adhesive layer 306A-B. This blend can be used as an adhesive by controlling the siloxane to epoxy resin ratio. By increasing the proportion of siloxane, an adhesive layer 306A-B with a reduced elastic modulus can be produced.

The adhesive layer 306A-B can include a blend of co-polymer, epoxy, or silicone. A co-polymer of siloxane and epoxy can be produced and mixed with an epoxy resin. Polysiloxane can have an epoxide group on a side chain thereof and can be synthesized from methylhydrosiloxane, epoxy resin.

The outer conductive foil 308A-B can be releasably coupled to the inner foil 304A-B, such as through the adhesive layer 306A-B. The outer conductive foil 308A-B can include a conductive material such as copper, gold, silver, aluminum, a combination thereof, or other conductive material. The outer conductive foil 308A-B can include a thickness 316A-B that is greater than the thickness 314A-B of the inner foil 304A-B.

In one or more embodiments, the outer conductive foil 308A-B can include a thickness 316A-B of between about ten and forty micrometers. In one or more embodiments, the outer conductive foil 308A-B can include a thickness 316A-B of between about fifteen and twenty micrometers. In one or more embodiments, the outer conductive foil 308A-B can include a thickness 316A-B of about eighteen micrometers.

Figure 4:
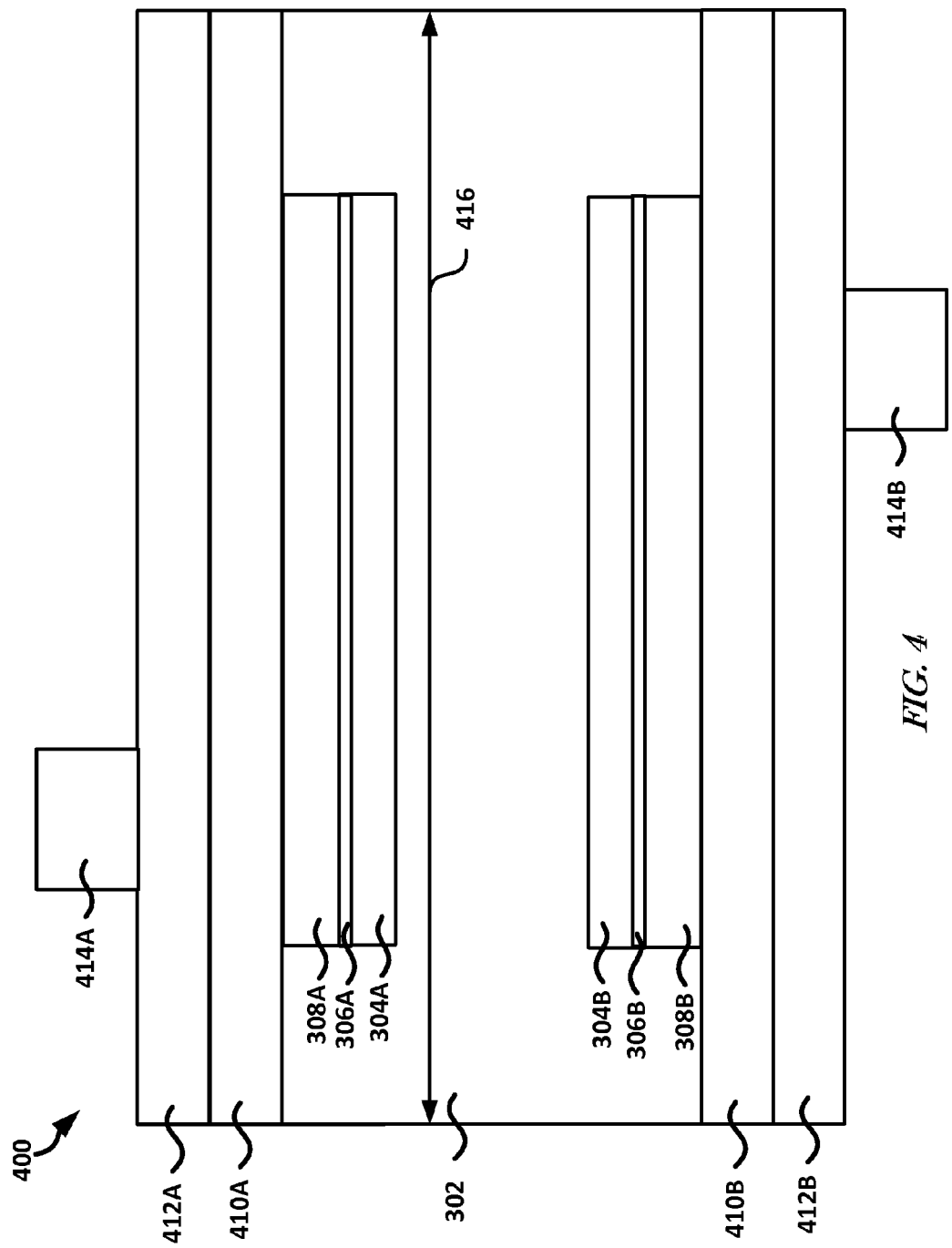
FIG. 4 shows a block diagram of another example of a core panel, according to one or more embodiments.

FIG. 4 shows a block diagram of a panel 400 that is similar to the panel 300 with a dielectric material 410A or 410B, a conductive foil 412A or 412B, or a die substrate 414A or 414B situated on or over the base 302. The dielectric material 410A-B can include an etch stop layer or a buildup film, such as an Ajinomoto Buildup Film (ABF). The conductive foil 412A-B can be substantially similar to the inner foil 304A-B or the outer conductive foil 308A-B with the conductive foil 412A-B including a width 416 that is greater than the width 310A-B of the inner foil 304A-B or the outer conductive foil 308A-B. The dielectric material 410A-B and the conductive foil 412A-B can be jointly considered a resin coated conductive layer.

The die substrate 414A-B can be situated on a top surface or a bottom surface of the panel 400. The die substrate 414A-B can be situated at least partially in the conductive foil 412A-B. The die substrate 414A-B can be situated on the outer conductive foil 308A-B.

While one die is shown in FIG. 4, multiple dies can be situated on the top surface or the bottom surface of the core panel 400. The die substrate 414A-B can be formed on the outer conductive foil 308A-B, respectively. The substrate 414A-B can include a Bumpless BuildUp Layer (BBUL) substrate, a Flip Chip substrate, a Surface Mount (SMT) substrate, or other type of substrate.

The die substrate 414A-B can include a cored die substrate, coreless die substrate, or a Bumpless Buildup Layer (BBUL) die substrate. A coreless die substrate can include a substrate that is built up and a die is attached to the die substrate after the die substrate is built. A cored die substrate can include a substrate that includes a die arranged in the substrate and at least a portion of the substrate is built around the die. A BBUL die substrate can include a substrate that includes a die with one or more buildup layers built above the die to form the die substrate.

The die substrate 414A-B can be released from (e.g., pulled off of or otherwise removed from) the panel 400, such as at the adhesive layer 306A-B. The panel 300 can be cut, such as to expose the interface 312A-B. The outer conductive foil 308A-B can be separated from the core panel 400, such as after the interface 312A-B has been exposed.

Figure 5:
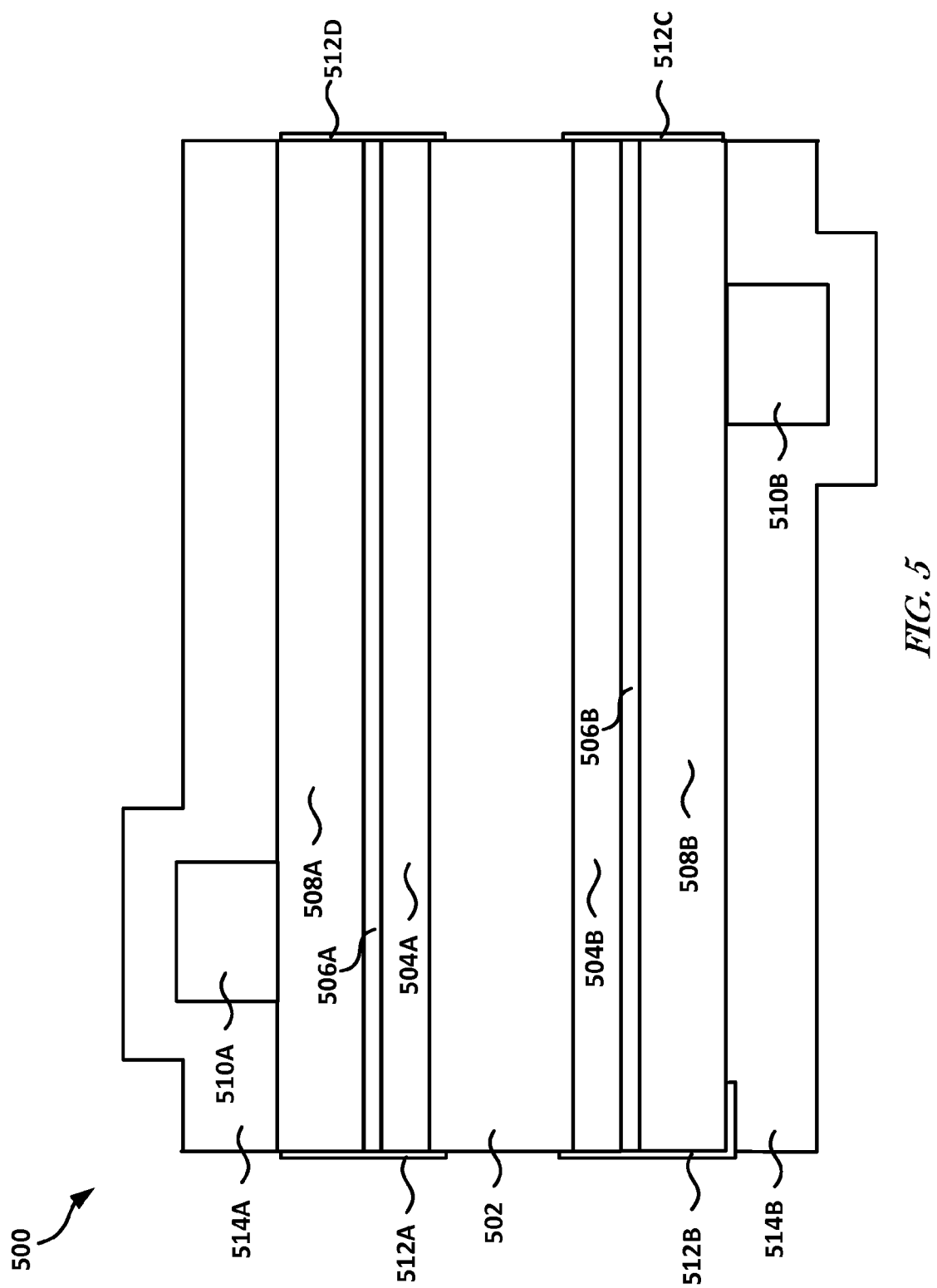
FIG. 5 shows a block diagram of another example of a core panel, according to one or more embodiments.

FIG. 5 shows an example of a panel 500 according to one or more embodiments. The panel 500 can be configured to protect an interface between an adhesive layer 506A or 506B and an inner foil 504A or 504B or an outer conductive foil 508A or 508B (e.g., the area of the panel 500 covered by a protective material 512A, 512B, 512C, or 512D). The panel 500 can include a base 502, the inner foil 504A-B, the adhesive layer 506A-B, the outer conductive foil 508A-B, a die 510A or 510B, or the protective material 512A-D.

The base 502 can include material similar to the base 302. The base 502 can be substantially rectangular. The inner foil 504A-B can include material similar to the material of the inner foil 304A-B. A periphery of the inner foil 504A-B can be substantially flush with a periphery of the base 502, such as shown in FIG. 5. The outer conductive foil 508A-B can include material similar to the material of the outer conductive foil 308A-B. A periphery of the outer conductive foil 508A-B can be substantially flush with a periphery of the base 502 or a periphery of the inner foil 304A-B, such as shown in FIG. 5.

The protective material 512A-D can be situated on the side of the panel 500 to protect an interface between the adhesive layer 506A-B and the outer conductive foil 508A-B or the inner foil 304A-B. The protective material 512A-D can help protect the interface from chemicals, heat, bumping, or other external forces that can delaminate or damage the material behind the protective material 512A-D. The protective material 512A-D can include a metal, polymer, or other material that can adhere to the panel 500, such as at the inner foil 504A-B, the outer conductive foil 508A-B, the adhesive layer 506A-B, or the base 502.

Processing required to make the panel 500 can be simpler or cheaper than the processing to make the panel 300. The processing can be simpler in that the inner foil 504A-B and the outer conductive foil 508A-B need not be processed to fit in a recess 318A-B of the base 302. Also, the base 502 does not need to be processed to include a recess in which the inner foil 304A-B or the outer conductive foil 308A-B can be situated in. By removing a processing step, the cost of manufacturing the panel 500 can be reduced. Manufacturing the panel 500 can be simpler than processing to make the panel 300 because the panel 500 does require the precise alignment considerations as in the manufacturing of the panel 300.

The panel 500 can be processed, such as to include dielectric material 514A-B over or around the substrate die 510A-B. Such embodiments can be considered "fully embedded" architectures, because the die 510A-B can be fully embedded in the build-up film (e.g., dielectric) layer(s). The die 510A-B can be separated from the panel 500 using a process similar to the process shown in FIGS. 7, 8, 9A, 9B, and 9C.

Figure 6:
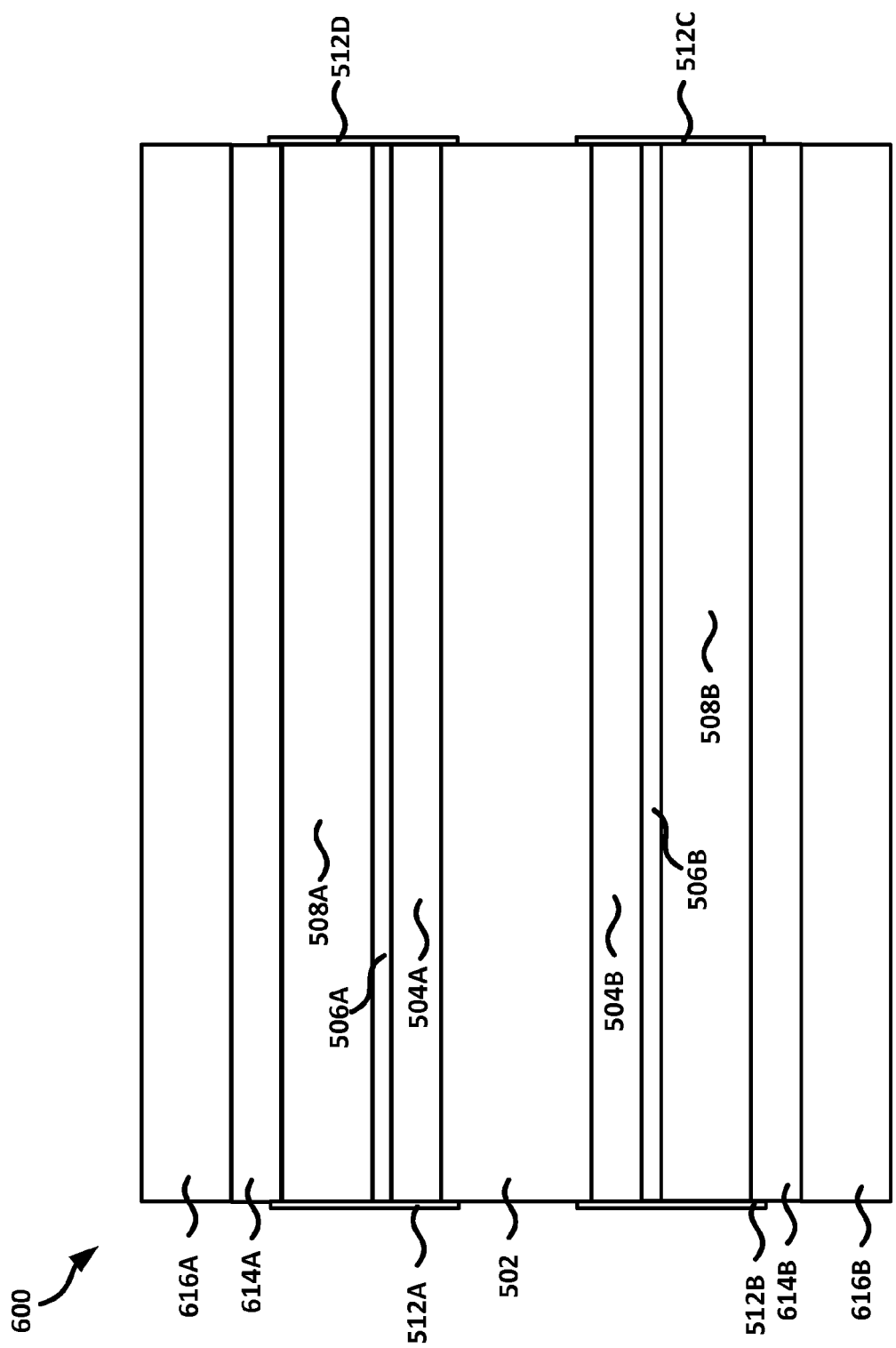
FIG. 6 shows a block diagram of another example of a core panel, according to one or more embodiments.

FIG. 6 shows an example of a panel 600 according to one or more embodiments. The panel 600 can be similar to the panel 500 with the panel 600 including a resin coated conductive layer (e.g., a conductive foil 616A or 616B on a dielectric material 614A or 614B) situated on the outer conductive foil 508A-B). The panel 600 can allow a partially embedded die substrate to be manufactured on the panel 600. The die can be considered partially embedded because the dielectric film only covers a portion of the die. The conductive foil that includes the recess therein that the die is inserted into can help cover the remainder of the die.

Figure 7:
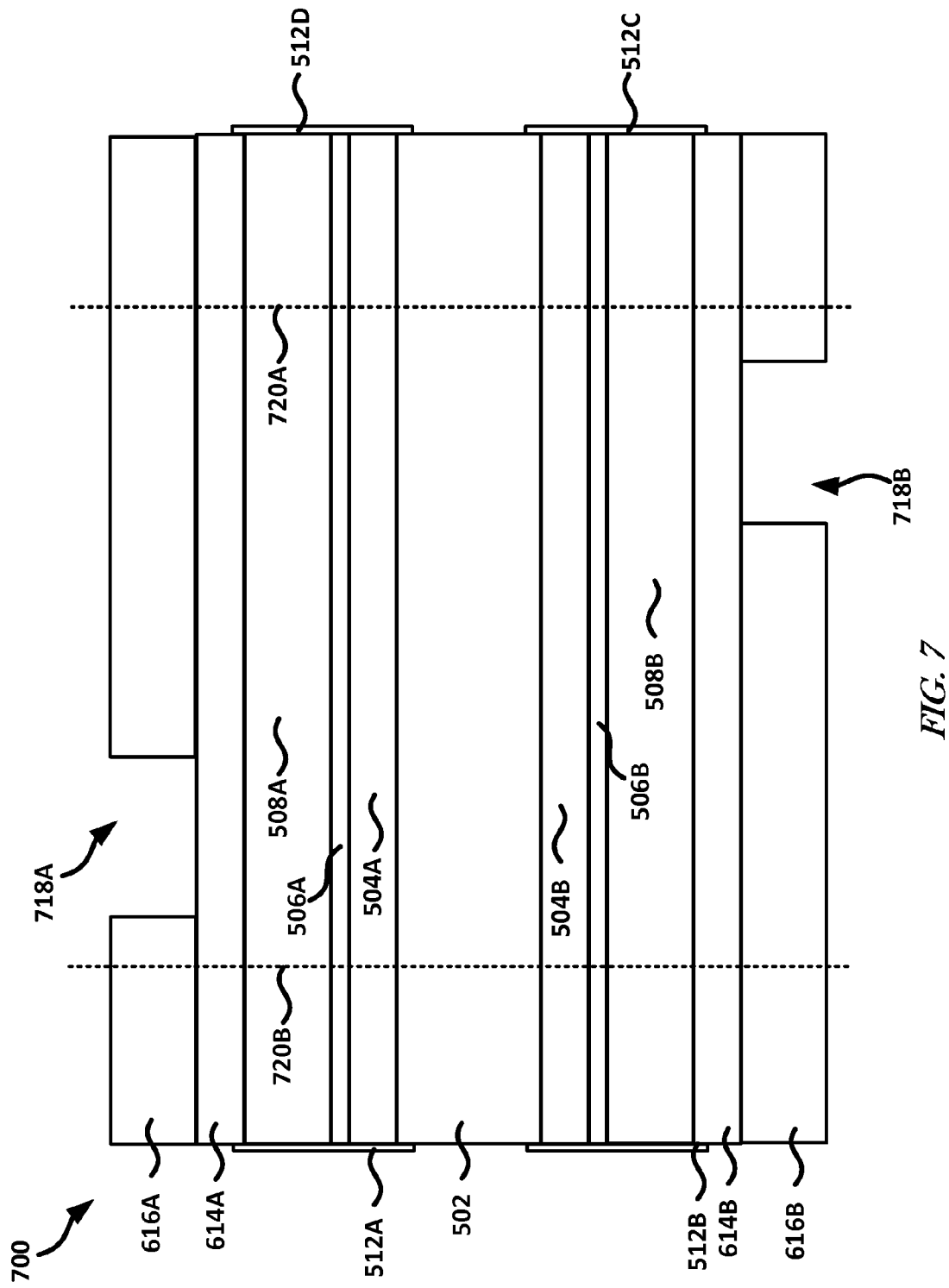
FIG. 7 shows a block diagram of the core panel of FIG. 6 with one or more recesses cut into an outer layer of the core panel.
Figure 8:
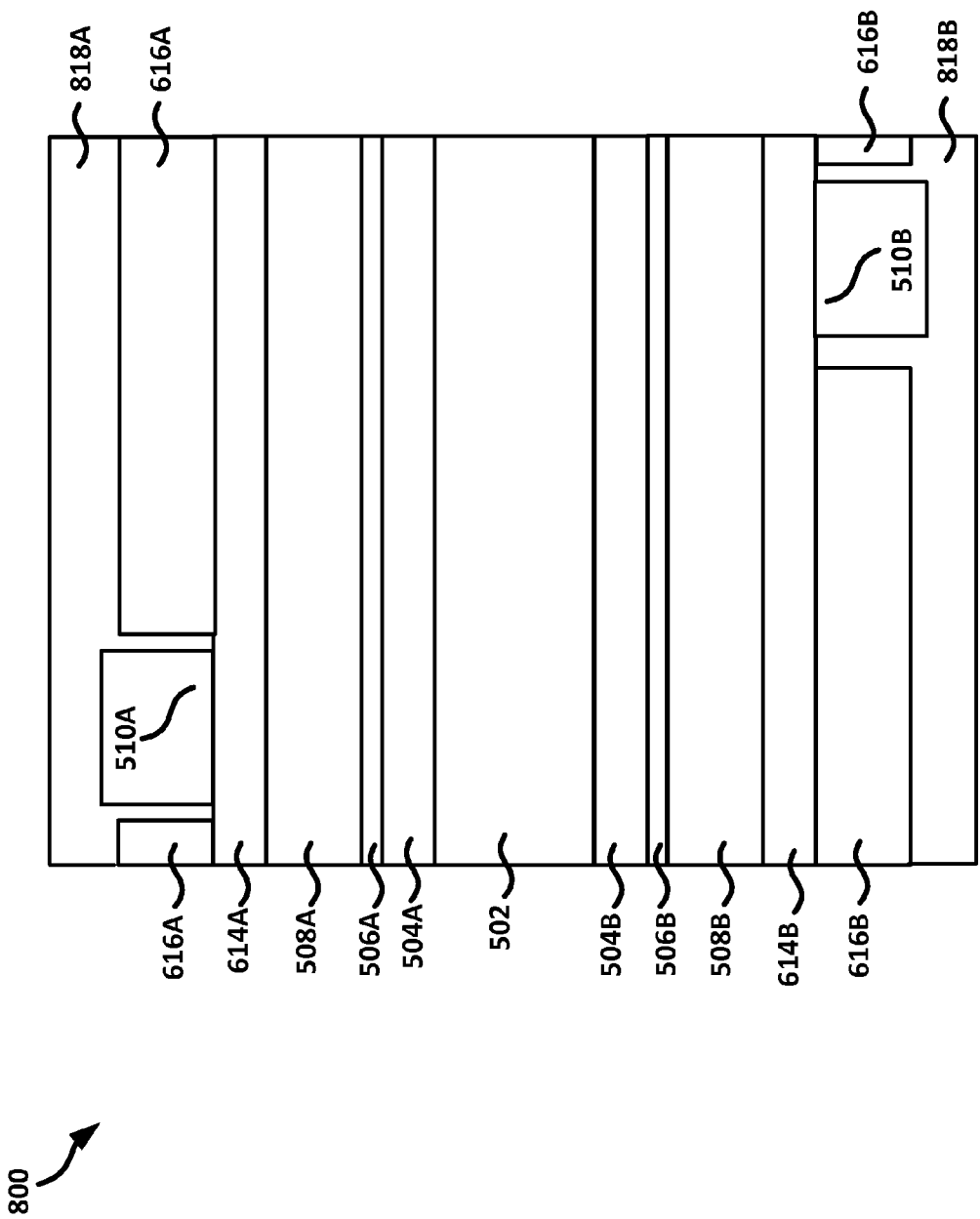
FIG. 8 shows a block diagram of the core panel of FIG. 6 or FIG. 7 after post-processing the core panel.

FIG. 7 shows the panel 700 that includes a recess 718A or 718B cut (e.g., etched) into the conductive foil 616A-B. A die 510A-B can be situated in the recess 718A-B, such as shown in FIG. 8. A dielectric material 818A-B can be situated on or around the die 510A-B or the conductive foil 616A-B. The panel 700 can be cut, such as at the dotted lines 720A-B, to remove the protective material 512A-D or a portion of the base 502, inner foil 504A-B, adhesive layer 506A-B, outer conductive foil 508A-B, dielectric material 614A-B, or conductive foil 616A-B. The resulting panel 800, after the panel 700 is cut, is shown in FIG. 8.

Figure 9A:
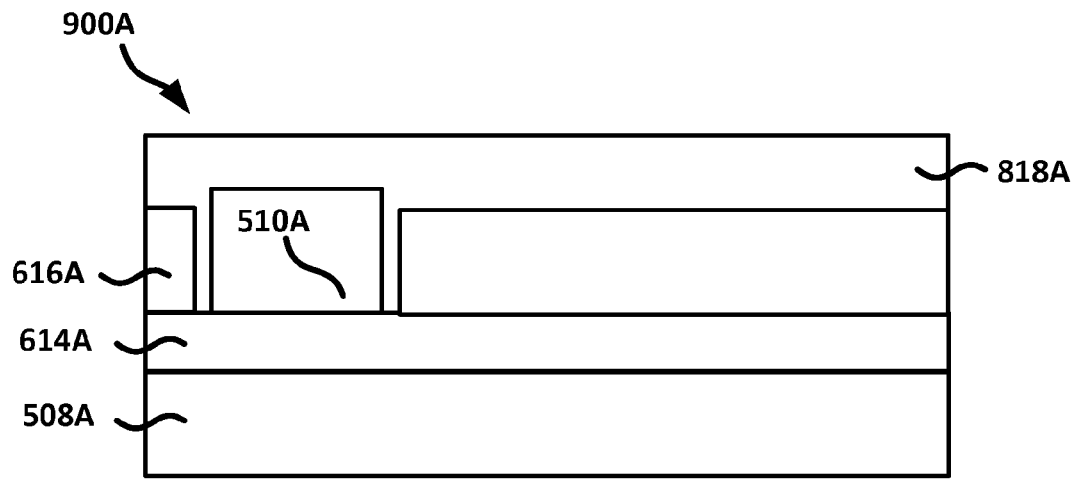
FIGS. 9A, 9B, and 9C each show a block diagram of a section of the core panel of FIG. 8 after post-processing.
Figure 9B:
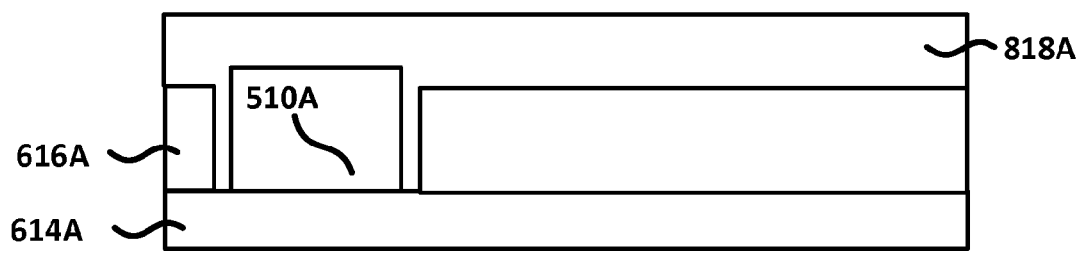
Figure 9C:
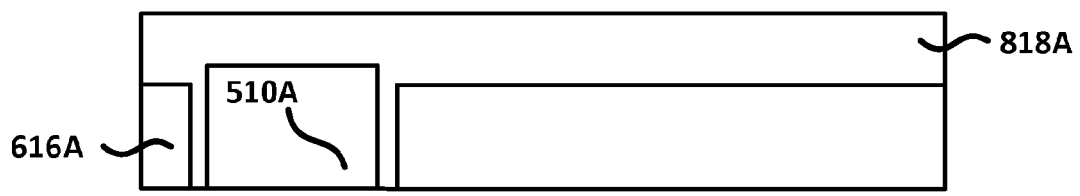

FIG. 9A shows the panel portion 900A that is a portion of the panel 800 that has been delaminated from the panel 800, such as at the adhesive layer 506A. The panel portion 900A can be released from the remainder of the panel 800 such as at the releasable coupling between the inner foil 504A and the outer conductive foil 508A. The outer conductive foil 508A can be removed (e.g., chemically removed such as by copper etching, or mechanically removed such as by blasting, shaving, or cutting the outer conductive foil 508A) from the panel portion 900A, such as shown in FIG. 9B. The dielectric material 614A can be removed (e.g., by wet blasting, shaving, or cutting the dielectric material 614A) from the die 510A substrate, such as is shown in FIG. 9C.

Note that while embodiments of panels discussed herein are double-sided (i.e. the panels include an inner foil, adhesive layer, and outer conductive foil all situated on opposite sides of the base), the panel can be one-sided. One sided panels are less efficient in terms of throughput, but can include simpler processing at a manufacturing facility.

An advantage of a panel discussed herein can include reduced cost as compared to the panel 100. The reduced cost can be due, at least in part, to the reduced cost in inner foil and outer conductive foil materials, since the conductive foils can be thinner than the conductive foils of the panel 100. Another advantage can include reduced warping or wrinkling in the conductive foils. The reduction in wrinkling or warping can be due to the protective material 512A-D or the recess 318A-B protecting an interface between the adhesive layer and the inner foil or the outer conductive foil.

Another advantage can include assembling a large panel and cutting the larger panel down into smaller panels for manufacturing.

The fully embedded architecture or the partially embedded architecture can be manufactured by situating the materials in the proper order and location (such as is shown in FIGS. 3-7) and pressing (e.g., hot pressing) the materials. The partially embedded architecture can be manufactured by manufacturing the fully embedded architecture and then pressing (e.g., hot pressing) the resin coated conductive layer on the fully embedded architecture.

Figure 10:
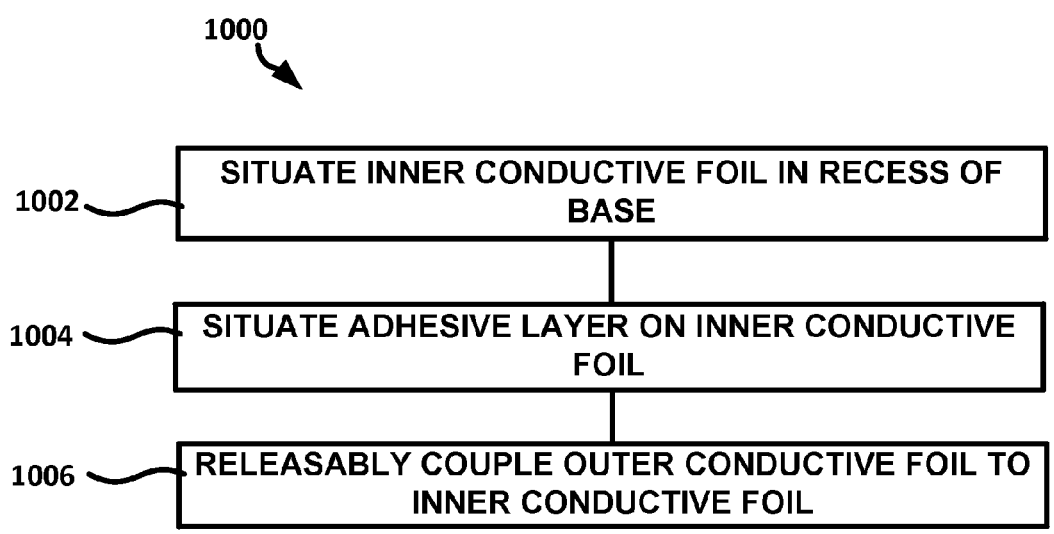
FIG. 10 shows an example of a technique for making a core panel.

FIG. 10 shows a flow diagram of an example of a technique 1000 of making a panel according to one or more embodiments. At 1002, a first inner foil can be situated in a first recess of a base. At 1004, an adhesive layer can be situated on the first inner foil or in the first recess. At 1006, a first outer conductive foil can be releasably coupled to the first inner foil, such as through the adhesive layer. The first outer conductive foil can be situated at least partially in the first recess. The first outer conductive foil can include a width that is substantially the same as a width of the first inner foil.

The base can include a second recess therein, the second recess in a side of the base that is opposite the first recess. situating a second inner foil in the second recess. The technique 1000 can include situating a second inner foil in the second recess. The technique 1000 can include situating a second adhesive layer on the second inner foil and in the second recess. The technique 1000 can include releasably coupling a second outer conductive foil to the second inner foil, such as through the adhesive layer. The second outer conductive foil can be situated at least partially in the second recess. The second outer conductive foil can include a width that is substantially the same as a width of the second inner foil.

The technique 1000 can include situating a first die on the first outer conductive foil. The technique 1000 can include encasing the first die in a first dielectric material. The technique 1000 can include situating a second dielectric material on the first outer conductive foil. The technique 1000 can include situating an outermost conductive foil on the second dielectric material. A width of the outermost conductive foil is substantially the same as a width of the base.

The technique 1000 can include situating a second die at least partially in a third recess, the third recess in the outermost conductive foil. The technique 1000 can include encasing the second die, at least partially in a second dielectric material.

Figure 11:
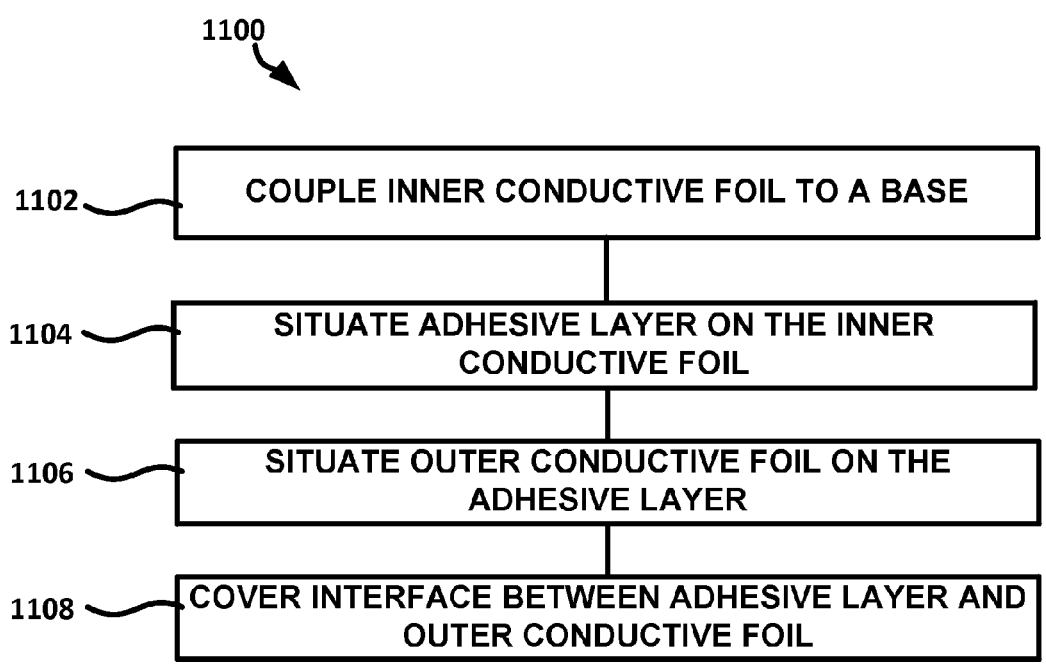
FIG. 11 shows an example of a technique for making a core panel.

FIG. 11 shows a flow diagram of an example of a technique 1100 of making a panel according to one or more embodiments. At 1102, an inner foil can be coupled to a base. At 1104, an adhesive layer can be situated on the inner foil. The inner foil can be substantially flush with a periphery of the base. At 1106, an outer conductive foil can be situated on the adhesive layer. A periphery of the outer conductive foil can be substantially flush with a periphery of the inner foil.

At 1108, an interface between the adhesive layer, the inner foil, or the outer conductive foil can be covered with a protective material. Covering the interface can include flowing the protective material over the interface. The protective material can include copper. The technique 1100 can include situating a resin coated copper layer on the outer conductive foil. The technique 1100 can include embedding, at least partially, a die in the resin coated copper layer. The technique 1100 can include situating a dielectric material over the resin coated copper layer so as to at least partially encase the die in the dielectric material. The technique 1100 can include situating a die substrate on the outer conductive foils. The die substrate can be a coreless substrate, cored substrate, or a Bumpless Buildup Layer (BBUL) substrate.

Figure 12:
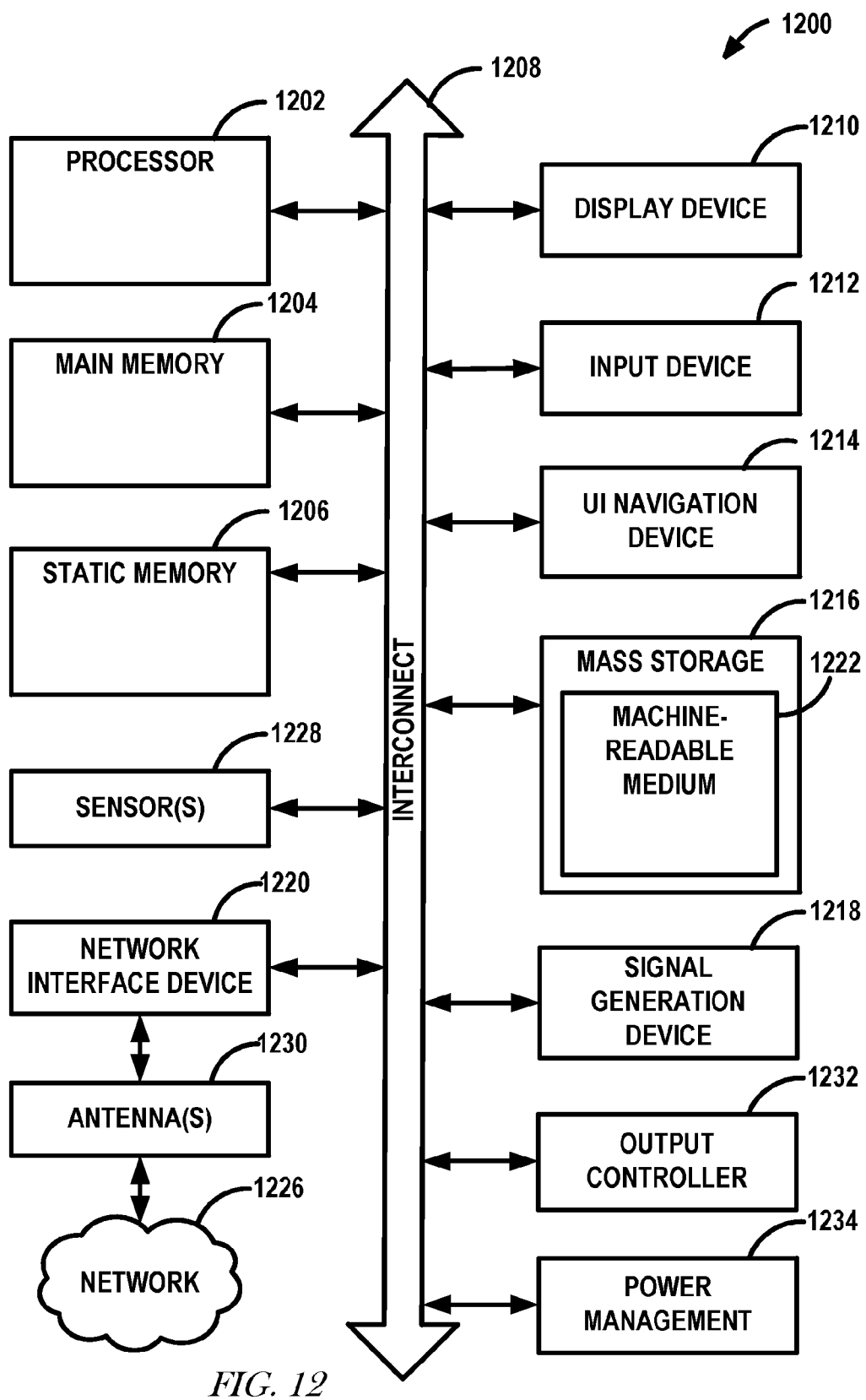
FIG. 12 shows an example of a computer system.

FIG. 12 is a block diagram illustrating an example computer system 1200 machine which can include a substrate that was built on a panel as discussed herein. Computer system 1200 can be a computing device. In an example, the machine can operate as a standalone device or can be connected (e.g., via a cellular network) to other machines. In a networked deployment, the machine can operate in the capacity of either a server or a client machine in server-client network environments, or it can act as a peer machine in peer-to-peer (or distributed) network environments. Further, while only a single machine is illustrated, the term "machine" shall also be taken to include any collection of machines that individually or jointly execute a set (or multiple sets) of instructions to perform any one or more of the methodologies discussed herein.

Example computer system 1200 can include a processor 1202 (e.g., a Central Processing Unit (CPU), a Graphics Processing Unit (GPU) or both), a main memory 1204 and a static memory 1206, which communicate with each other via an interconnect 1208 (e.g., a link, a bus, etc.). The computer system 1200 can further include a video display unit 1210, an alphanumeric input device 1212 (e.g., a keyboard), and a User Interface (UI) navigation device 1214 (e.g., a mouse). In an example, the video display unit 1210, input device 1212 and UI navigation device 1214 are a touch screen display. The computer system 1200 can additionally include a storage device 1216 (e.g., a drive unit), a signal generation device 1218 (e.g., a speaker), an output controller 1232, a power management controller 1234, and a network interface device 1220 (which can include or operably communicate with one or more antennas 1230, transceivers, or other wireless communications hardware), and one or more sensors 1228, such as a GPS sensor, compass, location sensor, accelerometer, or other sensor. The antennas 1230 can be coupled to a network 1226. Any of the items of the system 1200 can include a substrate that was built on a panel discussed herein.

Examples and Notes

The present subject matter may be described by way of several examples.

Example 1 can include or use subject matter (such as an apparatus, a method, a means for performing acts, or a device readable memory including instructions that, when performed by the device, can cause the device to perform acts), such as can include or use a panel including (1) a base including a first recess therein, (2) a first inner foil situated in the recess, (3) a first adhesive layer situated on the first inner foil and in the recess, and (4) a first outer conductive foil releasably coupled to the first inner foil through the adhesive layer, the first outer conductive foil situated at least partially in the recess and including a width that is substantially the same as a width of the first inner foil.

Example 2 can include or use, or can optionally be combined with the subject matter of Example 1 to include or use, wherein the base includes a second recess therein, the second recess in a side of the base that is opposite the first recess, the panel can include (1) a second inner foil situated in the second recess, (2) a second adhesive layer situated on the second inner foil and in the second recess, and a second outer conductive foil releasably coupled to the second inner foil through the adhesive layer, the second outer conductive foil situated at least partially in the second recess and including a width that is substantially the same as a width of the second inner foil.

Example 3 can include or use, or can optionally be combined with the subject matter of at least one of Examples 1-2 to include or use a first die situated on the first outer conductive foil.

Example 4 can include or use, or can optionally be combined with the subject matter of Example 3 to include or use a first dielectric material encasing the first die.

Example 5 can include or use, or can optionally be combined with the subject matter of at least one of Examples 1-2 to include or use a second dielectric material situated on the first outer conductive foil and an outermost conductive foil situated on the second dielectric material, wherein a width of the outermost conductive foil is substantially the same as a width of the base.

Example 6 can include or use, or can optionally be combined with the subject matter of Example 5 to include or use a third recess in the outermost conductive foil and a second die situated at least partially in the third recess.

Example 7 can include or use, or can optionally be combined with the subject matter of Example 6 to include or use a second dielectric material at least partially encasing the second die.

Example 8 can include or use, or can optionally be combined with the subject matter of at least one of Examples 1-7 to include or use, wherein the first inner foil includes a first thickness and the first outer conductive foil includes a second thickness, the first thickness smaller than the second thickness.

Example 9 can include or use subject matter (such as an apparatus, a method, a means for performing acts, or a device readable memory including instructions that, when performed by the device, can cause the device to perform acts), such as can include or use (1) situating a first inner foil in a first recess of a base, (2) situating a first adhesive layer on the first inner foil and in the first recess, or (3) releasably coupling a first outer conductive foil to the first inner foil through the adhesive layer, the first outer conductive foil situated at least partially in the first recess and including a width that is substantially the same as a width of the first inner foil.

Example 10 can include or use, or can optionally be combined with the subject matter of Example 9 to include or use, wherein the base includes a second recess therein, the second recess in a side of the base that is opposite the first recess. Example 10 can include or use (1) situating a second inner foil in the second recess, (2) situating a second adhesive layer on the second inner foil and in the second recess, or (3) releasably coupling a second outer conductive foil to the second inner foil through the adhesive layer, the second outer conductive foil situated at least partially in the second recess and including a width that is substantially the same as a width of the second inner foil.

Example 11 can include or use, or can optionally be combined with the subject matter of at least one of Examples 9-10 to include or use, situating a first die on the first outer conductive foil.

Example 12 can include or use, or can optionally be combined with the subject matter of Example 11 to include or use, encasing the first die in a first dielectric material.

Example 13 can include or use, or can optionally be combined with the subject matter of at least one of Examples 9-10 to include or use, situating a second dielectric material on the first outer conductive foil and situating an outermost conductive foil on the second dielectric material, wherein a width of the outermost conductive foil is substantially the same as a width of the base.

Example 14 can include or use, or can optionally be combined with the subject matter of Example 13 to include or use situating a second die at least partially in a third recess, the third recess in the outermost conductive foil.

Example 15 can include or use, or can optionally be combined with the subject matter of Example 14 to include or use encasing the second die, at least partially in a second dielectric material.

Example 16 can include or use subject matter (such as an apparatus, a method, a means for performing acts, or a device readable memory including instructions that, when performed by the device, can cause the device to perform acts), such as can include or use a panel including (1) a substantially rectangular base, (2) an inner foil mechanically coupled to the base, (3) an adhesive layer situated on the conductive foil, (4) an outer conductive foil situated on the adhesive layer, (5) protective material covering an interface between the adhesive layer, the inner foil and the outer conductive foil, or (6) wherein the inner foil includes a periphery that is substantially flush with a periphery of the base.

Example 17 can include or use, or can optionally be combined with the subject matter of Example 16 to include or use, wherein the protective material includes copper.

Example 18 can include or use, or can optionally be combined with the subject matter of at least one of Examples 16-17 to include or use, wherein the outer conductive foil includes a periphery that is substantially flush with a periphery of the inner foil.

Example 19 can include or use, or can optionally be combined with the subject matter of at least one of Examples 16-18 to include or use, wherein the inner foil includes a thickness that is less than a thickness of the outer conductive foil.

Example 20 can include or use, or can optionally be combined with the subject matter of Example 19 to include or use, wherein the thickness of the inner foil is between about three and six micrometers.

Example 21 can include or use, or can optionally be combined with the subject matter of Example 20 to include or use, wherein the thickness of the inner foil is about five micrometers.

Example 22 can include or use, or can optionally be combined with the subject matter of at least one of Examples 16-21 to include or use, wherein the thickness of the outer conductive foil is between about fifteen and twenty micrometers.

Example 23 can include or use, or can optionally be combined with the subject matter of Example 22 to include or use, wherein the thickness of the outer conductive foil is about eighteen micrometers.

Example 24 can include or use, or can optionally be combined with the subject matter of at least one of Examples 16-23 to include or use, a resin coated copper layer situated on the outer conductive foil.

Example 25 can include or use, or can optionally be combined with the subject matter of Example 24 to include or use, a die at least partially embedded in the resin coated copper layer, and a dielectric material situated over the resin coated copper layer and at least partially encasing the die.

Example 26 can include or use, or can optionally be combined with the subject matter of at least one of Examples 16-25 to include or use, a substrate situated on the outer conductive foil.

Example 27 can include or use, or can optionally be combined with the subject matter of Example 26 to include or use, wherein the substrate is a coreless substrate, cored substrate, or a Bumpless Buildup Layer (BBUL) substrate.

Example 28 can include or use subject matter (such as an apparatus, a method, a means for performing acts, or a device readable memory including instructions that, when performed by the device, can cause the device to perform acts), such as can include or use (1) coupling an inner foil to a base, (2) situating an adhesive layer on the inner foil, such that the inner foil is substantially flush with a periphery of the base, (3) situating an outer conductive foil on the adhesive layer, or (4) covering an interface between the adhesive layer, the inner foil and the outer conductive foil with a protective material.

Example 29 can include or use, or can optionally be combined with the subject matter of Example 28 to include or use, wherein covering the interface includes flowing the protective material over the interface, or wherein the protective material includes copper.

Example 30 can include or use, or can optionally be combined with the subject matter of at least one of Examples 28-29 to include or use, wherein situating the outer conductive foil includes situating the outer conductive foil such that a periphery of the outer conductive foil is substantially flush with a periphery of the inner foil.

Example 31 can include or use, or can optionally be combined with the subject matter of at least one of Examples 28-30 to include or use situating a resin coated copper layer on the outer conductive foil.

Example 32 can include or use, or can optionally be combined with the subject matter of Example 31 to include or use embedding, at least partially, a die in the resin coated copper layer, or situating a dielectric material over the resin coated copper layer so as to at least partially encase the die in the dielectric material.

Example 33 can include or use, or can optionally be combined with the subject matter of at least one of Examples 28-32 to include or use situating a die substrate on the outer conductive foil.

Example 34 can include or use, or can optionally be combined with the subject matter of Example 33 to include or use, wherein the die substrate is a coreless substrate, cored substrate, or a Bumpless Buildup Layer (BBUL) substrate.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A panel comprising:
    a base including a first recess therein;
    a first inner foil situated in the recess;
    a first adhesive layer situated on the first inner foil and in the recess;
    a first outer conductive foil releasably coupled to the first inner conductive foil through the adhesive layer, the first outer conductive foil situated at least partially in the recess and including a width that is substantially the same as a width of the first inner foil;
    a second dielectric material situated on the first outer conductive foil; and
    an outermost conductive foil situated on the second dielectric material, wherein a width of the outermost conductive foil is substantially the same as a width of the base, wherein the second dielectric material and the outermost conductive foil both individually overlay the entire outer conductive foil and all exposed portions of a surface of the base.

2. The panel of claim 1, wherein the base includes a second recess therein, the second recess in a side of the base that is opposite the first recess, the panel further comprising:
    a second inner foil situated in the second recess;
    a second adhesive layer situated on the second inner foil and in the second recess; and
    a second outer conductive foil releasably coupled to the second inner conductive foil through the adhesive layer, the second outer conductive foil situated at least partially in the second recess and including a width that is substantially the same as a width of the second inner foil.

3. The panel of claim 1, further comprising a first die situated on the first outer conductive foil.

4. The panel of claim 3, further comprising a first dielectric material encasing the first die.

5. The panel of claim 1, further comprising a third recess in the outermost conductive foil and a second die situated at least partially in the third recess.

6. The panel of claim 5, wherein the second dielectric material at least partially encases the second die.

7. A method comprising:
situating a first inner foil in a first recess of a base;
situating a first adhesive layer on the first inner foil and in the first recess;
releasably coupling a first outer conductive foil to the first inner conductive foil through the adhesive layer, the first outer conductive foil situated at least partially in the first recess and including a width that is substantially the same as a width of the first inner foil;
situating a second dielectric material on the first outer conductive foil; and
situating an outermost conductive foil on the second dielectric material,
wherein a width of the outermost conductive foil is substantially the same as a width of the base, wherein the second dielectric material and the outermost conductive foil both individually overlay the entire outer conductive foil and all exposed portions of a surface of the base.

8. The method of claim 7, wherein the base includes a second recess therein, the second recess in a side of the base that is opposite the first recess, the method further comprising:
situating a second inner foil in the second recess;
situating a second adhesive layer on the second inner foil and in the second recess; and
releasably coupling a second outer conductive foil to the second inner foil through the adhesive layer, the second outer conductive foil situated at least partially in the second recess and including a width that is substantially the same as a width of the second inner foil.

9. The method of claim 7, further comprising situating a first die on the first outer conductive foil.

10. The method of claim 9, further comprising encasing the first die in a first dielectric material.

11. The method of claim 7, further comprising:
situating a second die at least partially in a third recess, the third recess in the outermost conductive foil; and
encasing the second die, at least partially in the second dielectric material.

12. A panel comprising:
a substantially rectangular base;
an inner foil mechanically coupled to the base;
an adhesive layer situated on the conductive foil;
an outer conductive foil situated on the adhesive layer; and
protective material covering an interface between the adhesive layer, the inner foil and the outer conductive foil, and wherein the protective material further contacts a side of the base,
wherein the inner foil includes a periphery that is flush with a periphery of the base.

13. The panel of claim 12, wherein the protective material includes copper.

14. The panel of claim 12, wherein the outer conductive foil includes a periphery that is substantially flush with a periphery of the inner foil.

15. The panel of claim 12, wherein the inner foil includes a thickness that is less than a thickness of the outer conductive foil.

16. The panel of claim 12, further comprising a resin coated copper layer situated on the outer conductive foil.

17. The panel of claim 16, further comprising:
a die at least partially embedded in the resin coated copper layer; and
a dielectric material situated over the resin coated copper layer and at least partially encasing the die.

18. A method comprising:
coupling an inner foil to a base;
situating an adhesive layer on the inner foil, such that the inner foil is flush with a periphery of the base;
situating an outer conductive foil on the adhesive layer; and
covering an interface between the adhesive layer, the inner foil and the outer conductive foil with a protective material, wherein the protective material contacts a side of the base.

19. The method of claim 18, wherein covering the interface includes flowing the protective material over the interface, wherein the protective material includes copper.

20. The method of claim 18, wherein situating the outer conductive foil includes situating the outer conductive foil such that a periphery of the outer conductive foil is substantially flush with a periphery of the inner foil.

21. The method of claim 18, further comprising situating a resin coated copper layer on the outer conductive foil.

22. The method of claim 21, further comprising:
embedding, at least partially, a die in the resin coated copper layer; and
situating a dielectric material over the resin coated copper layer so as to at least partially encase the die in the dielectric material.

23. The method of claim 18, further comprising:
situating a die substrate on the outer conductive foil.

* * * * *